(12) United States Patent
Kurii et al.

(10) Patent No.: US 6,746,621 B2
(45) Date of Patent: Jun. 8, 2004

(54) MICRO-ETCHING COMPOSITION FOR COPPER OR COPPER ALLOY, MICRO-ETCHING METHOD, AND METHOD FOR MANUFACTURING PRINTED CIRCUIT BOARD

(75) Inventors: Yoshihiro Kurii, Amagasaki (JP); Etsuji Kameda, Amagasaki (JP); Sachiko Nakamura, Amagasaki (JP)

(73) Assignee: Mec Co., Ltd., Amagasaki (JP)

( * ) Notice: Subject to any disclaimer, the term of this patent is extended or adjusted under 35 U.S.C. 154(b) by 102 days.

(21) Appl. No.: 09/912,318

(22) Filed: Jul. 26, 2001

(65) Prior Publication Data

US 2002/0038790 A1 Apr. 4, 2002

(30) Foreign Application Priority Data

Jul. 28, 2000 (JP) .......................... 2000-229472

(51) Int. Cl.$^7$ .................. C09K 13/00; C09K 13/04; C09K 13/06; H01L 21/302
(52) U.S. Cl. .................. 252/79.1; 252/79.2; 252/79.4; 438/745
(58) Field of Search ............... 252/79.1, 79.2, 252/79.4; 438/745, 692

(56) References Cited

U.S. PATENT DOCUMENTS

| | | | | |
|---|---|---|---|---|
| 4,636,282 A | * | 1/1987 | Wong | 156/659.1 |
| 5,030,373 A | * | 7/1991 | Kimura et al. | 252/79.4 |
| 5,869,130 A | | 2/1999 | Ferrier | 427/98 |
| 6,013,572 A | * | 1/2000 | Hur et al. | 428/614 |
| 6,117,250 A | * | 9/2000 | Schemenaur et al. | 148/248 |
| 6,506,314 B1 | * | 1/2003 | Whitney et al. | 216/100 |

FOREIGN PATENT DOCUMENTS

| | | |
|---|---|---|
| JP | 08-335763 | 12/1996 |
| JP | 10-096088 | 4/1998 |
| JP | 11-021517 | 1/1999 |
| JP | 11-029883 | 2/1999 |
| JP | 11-140669 | 5/1999 |
| JP | 11-315381 | 11/1999 |

* cited by examiner

*Primary Examiner*—Nadine G. Norton
*Assistant Examiner*—Lynette T. Umez-Eronini
(74) *Attorney, Agent, or Firm*—Oblon, Spivak, McClelland, Maier & Neustadt, P.C.

(57) ABSTRACT

A micro-etching composition and a printed circuit board fabricated by using the micro-etching composition are provided. The micro-etching composition, comprising a main ingredient consisting of sulfuric acid and hydrogen peroxide and an assisting ingredient consisting of phenyltetrazole and a chloride ion source, can continuously treat the surface of copper and copper alloys to produce fine microscopic pits for improved adhesion to resins without producing a brown or black deposit. The printed circuit board exhibits excellent adhesion between inner layer circuit patterns and insulation resin layers, and is free from haloing.

10 Claims, No Drawings

MICRO-ETCHING COMPOSITION FOR COPPER OR COPPER ALLOY, MICRO-ETCHING METHOD, AND METHOD FOR MANUFACTURING PRINTED CIRCUIT BOARD

BACKGROUND OF THE INVENTION

1. Field of the Invention

The present invention relates to a micro-etching composition for copper or copper alloys useful in the manufacture of printed circuit boards and the like, and a micro-etching method using the micro-etching composition.

2. Description of the Background Art

A multilayer printed circuit board is a laminated board having a plurality of conductive layers, each separated from the others by an insulating layer. Through-holes of which the inside is plated with the copper are formed through the multilayer printed circuit board. The conductive layers in the multilayer printed circuit board are electrically connected by the through-holes.

The conductive layers are made from copper and the insulating layers are made from a resin. Both the copper and the resins exhibit poor adhesion. To improve the adhesion of the copper with the resins, the surface of the copper is treated with a strong alkaline aqueous solution at a high temperature to produce fine needle-like copper oxide on the surface of the copper. This treatment is called "oxide treatment".

However, the needle-like copper oxide formed on the copper surface is easily dissolved in an acidic plating solution used in the plating process for the through-holes. The phenomenon of copper oxide dissolution is called "haloing". Moreover, the oxide treatment process not only involves poor work performance, but also takes a long time. To overcome these problems, a method of reducing the needle-like copper oxide to copper while retaining the needle-like configuration, thereby rendering the surface less soluble in an acidic plating solution has been used. However, this method is not preferable because of a larger number of process steps.

As a method involving a smaller number of process steps and exhibiting better productivity, a method of improving adhesiveness of copper with a resin by roughening the copper surface using a micro-etching composition comprising sulfuric acid and hydrogen peroxide as a main ingredient has been studied.

For example, Japanese Patent No. 2740768 describes a method of roughening the copper surface using an aqueous solution containing an inorganic acid, hydrogen peroxide, a corrosion inhibitor such as benzotriazole, and a surfactant. Japanese Patent Application Laid-open No. 96088/1998 describes a method of roughening the copper surface using an aqueous solution containing an inorganic acid, a peroxide, an azole compound such as benzotriazole, and a halide compound. Japanese Patent Application Laid-open No. 21517/1999 describes a method of roughening the copper surface using an aqueous solution containing an oxidizing agent such as an acid or hydrogen peroxide, a corrosion inhibitor such as benzotriazole, and a halide ion. Japanese Patent Application Laid-open No. 29883/1999 describes a method of roughening the copper surface using an aqueous solution containing sulfuric acid, hydrogen peroxide, and a tetrazole derivative such as a phenyltetrazole. Japanese Patent Application Laid-open No. 315381/1999 describes a method of roughening the copper surface using an aqueous solution containing an inorganic acid, hydrogen peroxide, and an amine compound. Japanese Patent Application Laid-open No. 140669/1999 describes a method of roughening the copper surface using an aqueous solution containing an inorganic acid, hydrogen peroxide, and a stabilizer such as an alkane sulfonic acid.

However, the method of using these micro-etching compositions also has drawbacks such as insufficient adhesion with resins and production of a brown or black deposit during the copper treatment with these compositions. Further improvement of these micro-etching compositions has been desired.

An object of the present invention is therefore to provide a micro-etching composition for copper or copper alloys free from the above drawbacks, exhibiting improved adhesion with resins, and capable of continuously treating copper and copper alloys without producing a brown or black deposit, as well as a method of micro-etching using such a micro-etching composition.

As a result of extensive studies, the inventors of the present invention have found that the surfaces of copper and copper alloys can be sufficiently roughened without producing a brown or black deposit when such surfaces are continuously treated by using a micro-etching composition containing sulfuric acid and hydrogen peroxide and an assisting ingredient with a novel combination.

SUMMARY OF THE INVENTION

Specifically, the above object is solved in the present invention by an aqueous solution for micro-etching copper or a copper alloy comprising a main ingredient consisting of sulfuric acid and hydrogen peroxide and an assisting ingredient consisting of a phenyltetrazole and a chloride ion source (such an aqueous solution is hereinafter referred to as "micro-etching composition").

In the above micro-etching composition, the concentration of sulfuric acid is preferably 60–220 g/l.

In the above micro-etching composition, the concentration of hydrogen peroxide is preferably 5–70 g/l.

In the above micro-etching composition, preferable examples of the phenyltetrazole are 1-phenyltetrazole or 5-phenyltetrazole.

In the above micro-etching composition, the concentration of the phenyltetrazole is preferably 0.01–0.4 g/l.

In the above micro-etching composition, the chloride ion source is one or more compounds selected from the group consisting of sodium chloride, potassium chloride, ammonium chloride, and hydrochloric acid.

In the above micro-etching composition, the concentration of the chloride ion source is preferably 1–60 ppm.

In a preferred embodiment of the present invention, the above micro-etching composition further comprises a benzene sulfonic acid.

In the above micro-etching composition, the benzene sulfonic acid is one or more compounds selected from the group consisting of benzene sulfonic acid, toluene sulfonic acid, m-xylene sulfonic acid, phenol sulfonic acid, cresol sulfonic acid, sulfosalicylic acid, m-nitro benzene sulfonic acid, and p-amino benzene sulfonic acid.

The above object is further solved according to the present invention by a method of micro-etching a surface of copper or a copper alloy comprising causing the surface of copper or a copper alloy to come into contact with the micro-etching composition, thereby roughening the surface to the etching amount of 0.5–3 $\mu$m.

The above object is further solved according to the present invention by a method of manufacturing a printed circuit board comprising: micro-etching a surface of copper or a copper alloy by causing the surface of copper or a copper alloy to come into contact with the micro-etching composition, thereby roughening the surface to the etching amount of 0.5–3 $\mu$m, and laminating insulating resin layers.

Other objects, features and advantages of the invention will hereinafter become more readily apparent from the following description.

DETAILED DESCRIPTION OF THE INVENTION AND PREFERRED EMBODIMENTS

Although the concentration of sulfuric acid in the micro-etching composition of the present invention is suitably adjusted according to the etching rate and the solubility of copper in the etching solution, such a concentration is usually 60–220 g/l, and preferably 90–220 g/l. If the concentration is less than 60 g/l, the etching rate becomes slow. If the concentration is more than 220 g/l, not only can any increase corresponding to the increase in the concentration not be seen, but also copper sulfate crystals tend to deposit.

Although the concentration of hydrogen peroxide in the micro-etching composition of the present invention is suitably adjusted according to the etching rate and the desired surface roughening capability, such a concentration is usually 5–70 g/l, and preferably 7–56 g/l. If the concentration of hydrogen peroxide is less than 5 g/l, the etching rate is slow and the micro-etching composition cannot adequately roughen the copper surface; if more than 70 g/l, on the other hand, the etching rate becomes too fast to perform uniform etching, resulting in insufficient roughening of the copper surface.

In addition to the main ingredient consisting of sulfuric acid and hydrogen peroxide, the micro-etching composition of the present invention comprises an assisting ingredient consisting of a phenyltetrazole and a chloride ion source, to suppress decomposition of hydrogen peroxide and adequately roughen the surface of the copper or copper alloy. In the present invention, the use of a phenyltetrazole among various azole compounds, such as imidazole, triazole, tetrazole, and the like, ensures sufficient roughening of the surface of the copper or copper alloys and remarkable suppression of decomposition of hydrogen peroxide.

As examples of the phenyltetrazole, 1-phenyltetrazole, 5-phenyltetrazole, and the like can be given. Of these, 5-phenyltetrazole is particularly preferable in view of high solubility in water. Inasmuch as the effect of the present invention can be adequately exhibited, the phenyltetrazole may contain a substituent such as —$NH_2$, —SH, etc. or may be a metal salt such as a salt of calcium, copper, sodium, or the like.

Although the concentration of phenyltetrazole can be suitably adjusted according to the roughening configuration, the solubility of copper in the etching solution, and the like, the concentration is preferably 0.01–0.4 g/l, and more preferably 0.03–0.35 g/l. If the concentration of phenyltetrazole is less than 0.01 g/l, the etching rate is too slow to adequately roughen the copper surface; if more than 0.4 g/l, it is difficult to dissolve the phenyltetrazole in the solution in a stable manner.

As examples of the chloride ion source, sodium chloride, potassium chloride, ammonium chloride, hydrochloric acid, and the like can be given.

Although the concentration of the chloride ion source is suitably adjusted according to the desired roughening configuration and the etching rate, such a concentration is preferably 1–60 ppm, and more preferably 2–10 ppm. If the concentration of the chloride ion source is less than 1 ppm, the copper surface cannot be adequately roughened; if more than 60 ppm, the etching rate also becomes too slow to adequately roughen the copper surface.

When continuously processing a large amount of copper or copper alloy using the micro-etching composition of the present invention, it is desirable to add a benzene sulfonic acid to control the decomposition of hydrogen peroxide. Conventionally, a benzene sulfonic acid has been known to be oxidized by hydrogen peroxide in a micro-etching composition and produce a brown or black precipitate (Japanese Patent Application Laid-open No. 140669/1999). The combined use of a benzene sulfonic acid and a phenyltetrazole in the present invention controls decomposition of hydrogen peroxide, thereby preventing such brown or black precipitate from being produced. Benzene sulfonic acid, toluene sulfonic acid, m-xylene sulfonic acid, phenol sulfonic acid, cresol sulfonic acid, sulfosalicylic acid, m-nitro benzene sulfonic acid, p-amino benzene sulfonic acid, and the like can be given as examples of benzene sulfonic acids.

Although the concentration of the benzene sulfonic acid can be suitably adjusted according to the degree of stability of hydrogen peroxide in the solution, the concentration is preferably 10 g/l or less, and more preferably 2–4 g/l. The concentration of benzene sulfonic acid exceeding 10 g/l does not bring about the effect of hydrogen peroxide stabilization in proportion to the increase in the concentration.

Various other additives such as a defoaming agent and surfactant may be optionally incorporated into the micro-etching composition of the present invention.

The micro-etching composition of the present invention can be easily prepared by dissolving the above-described components in water. Ion-exchanged water is preferably used as the water for this purpose.

As the method of applying the micro-etching composition of the present invention, a method of spraying the micro-etching composition onto copper or a copper alloy, a method of immersing the copper or copper alloy in the micro-etching composition, and the like are given.

Although the amount of etching can be suitably determined according to the type of the resin coated on the copper surface and other conditions, an etching amount of 0.5–3 $\mu$m is preferable, with a more preferable etching amount being 1–2.5 $\mu$m. If the etching amount is less than 0.5 $\mu$m, the copper surface cannot be sufficiently roughened. An etching amount in excess of 3 $\mu$m does not improve the adhesion of the copper surface with the resins. The etching amount in the present invention indicates the etching depth calculated from the weight change of the sample before and after etching, the surface area of copper, and the density of copper. The etching amount can be adjusted by changing the composition of the micro-etching composition or controlling the temperature or the etching time. The temperature for the micro-etching operation using the micro-etching composition is usually in the range of 20–40° C., and the etching time is usually from 10 to 120 seconds.

The surface of copper or copper alloy processed by the micro-etching composition of the present invention is adequately roughened with deep microscopic pits uniformly formed. The surface exhibits superior adhesiveness with resins. When used for the manufacture of multilayer printed circuit boards, for example, the inner layer copper substrate is first degreased, washed with water, and etched in the amount of 0.5–3 $\mu$m by spraying the micro-etching composition of the present invention, thereby roughening the copper surface. The copper substrate is then washed with water and dried. If the inner layer substrate thus obtained is laminated with a prepreg and pressed, the substrate is firmly joined with the prepreg by the anchoring effect of the microscopic pit on the copper surface. This prevents peeling of the copper from the prepreg in the interface even if a heat stress is applied to the printed circuit board during a reflow soldering operation, for example.

The micro-etching composition of the present invention can be widely used for various purposes. For example, in addition to lamination of prepreg, the micro-etching composition can be used for improving adhesion of copper surface with resins such as a solder resist, dry film resist, electrocoating resist, adhesive, and the like. The micro-etching composition of the present invention is particularly effective for the improvement of adhesion between a circuitry pattern and an interlayer insulation resin of a built-up printed circuit board. The micro-etching composition can also be used for a surface treatment of lead frames, whereby adhesion of a sealing resin with a lead frame can be improved.

The resins used for these purposes include, but are not limited to, phenol resin, epoxy resin, thermoresistant epoxy resin, polyimide, bis maleimide-triazine resin, and polyphenylene ether.

Moreover, because the surface of the copper or copper alloy roughened by the micro-etching composition of the present invention exhibits excellent soldering and plated metal adhesion, the micro-etching composition is useful for the pretreatment of solder coating, electrolytic plating, and electroless plating of printed circuit boards.

Furthermore, the micro-etching composition of the present invention can control the gloss or color tone of copper or copper alloy after the etching processing by controlling the etching amount. For example, if the gloss is reduced, resolution can be improved when the surface of copper or copper alloy is used as a ground texture for a photosensitive resin, malfunctions of an automatic optical inspection machine (AOI) of printed circuit boards can be decreased, and reflection of a laser beam from the copper surface can be reduced when through-holes are produced in a printed circuit board by a laser beam.

Other features of the invention will become apparent in the course of the following description of the exemplary embodiments which are given for illustration of the invention and are not intended to be limiting thereof.

EXAMPLES

Examples 1–6

Comparative Examples 1–4

<Solder Heat Resistance>

The micro-etching compositions, each having the formulations shown in Table 1, were sprayed onto glass fabric epoxy resin-impregnated copper-clad laminated boards (FR-4 grade), the both sides of which were clad with a copper foil with a thickness of 18 $\mu$m at 25° C. for 30 seconds, thereby etching the copper surface. The etching amount was 2 $\mu$m (Example 1). The resulting surface was observed by an electronic microscope at a magnification of 3500. The results are shown in Table 1.

A glass fabric epoxy resin-impregnated prepreg (FR-4 grade) was laminated onto each side of the copper-clad laminated board, pressed, and the periphery was cut off, thus providing a test piece. Next, a 2 atmospheric pressure load was applied to the test piece for 4 hours at 121° C. and 100% RH using a pressure cooker. The test piece was then immersed in a molten solder bath for one minute at 270° C. to evaluate the solder heat resistance according to JIS C6481. The results are shown in Table 1.

<Peel-off Strength>

The micro-etching compositions, each having the formulations shown in Table 1, were sprayed onto the shiny side of electrolytic copper foils with a thickness of 70 $\mu$m at 25° C. for 30 seconds, thereby etching the copper surface. The above prepreg was laminated and pressed onto the treated surface of the copper foil. To measure the peel-off strength, the copper foil was removed except for the area of a stripe with a width of 1 cm according to JIS C6481. The results are shown in Table 1.

<Haloing>

The micro-etching compositions, each having the formulations shown in Table 1, were sprayed onto glass fabric epoxy resin-impregnated copper-clad laminated boards (FR-4 grade), both sides of which were clad with a copper foil with a thickness of 35 $\mu$m at 25° C. for 30 seconds, thereby etching the copper surface. A copper foil with a thickness of 18 $\mu$m was laminated onto each side of the resulting laminated board, with the above prepregs being placed in between.

Holes with a diameter of 0.4 mm were drilled through the four layer substrates thus obtained at a drilling rotation of 7000 rpm. The four-layer board was immersed in a 4 N hydrochloric acid solution for two hours, removed from the hydrochloric acid solution, and the surface was horizontally ground to observe the inner layer of the copper foil. The inner layer was inspected for the presence of haloes, using a microscope with a magnification of 100 times. The results are shown in Table 1.

<Precipitate>

Copper was dissolved in the micro-etching compositions with formulations shown in Table 1 in an amount of 30 g per liter. The solution was allowed to stand for 168 hours at 25° C. to examine production of precipitate. The results are shown in Table 1.

Comparative Example 5

The same experiment as in Example 1 was carried out using an aqueous solution containing 180 g/l of chlorous acid, 32 g/l of sodium hydroxide, and 10 g/l of sodium phosphate (an oxide treatment) instead of the micro-etching composition. A black oxide film produced on the copper surface by immersing the sample for five minutes at 70° C. was examined in the same manner as in Example 1. The results are shown in Table 1.

TABLE 1

|  | Composition (g/l) | | Surface after micro-etching | Solder heat resistance | Peel strength (N/mm) | Haloing | Precipitate |
|---|---|---|---|---|---|---|---|
| Example 1 | Sulfuric acid | 100 | Fine and deep microscopic pits were homogeneously formed | No swelling of prepreg | 1.3 | None | None |
|  | Hydrogen peroxide | 30 | | | | | |
|  | 5-Phenyltetrazole | 0.2 | | | | | |
|  | Toluenesulfonic acid | 2 | | | | | |
|  | Sodium chloride | 3 ppm (Chloride ion conc.) | | | | | |
|  | Ion exchanged water | Balance | | | | | |
| Example 2 | Sulfuric acid | 100 | The same as above | The same as above | 1.3 | None | None |
|  | Hydrogen peroxide | 30 | | | | | |
|  | 5-Phenyltetrazole | 0.2 | | | | | |
|  | Phenol sulfonic acid | 2 | | | | | |
|  | Sodium chloride | 3 ppm (Chloride ion conc.) | | | | | |
|  | Ion exchanged water | Balance | | | | | |
| Example 3 | Sulfuric acid | 100 | The same as above | The same as above | 1.3 | None | None |
|  | Hydrogen peroxide | 30 | | | | | |
|  | 5-Phenyltetrazole | 0.2 | | | | | |
|  | Cresol sulfonic acid | 2 | | | | | |
|  | Sodium chloride | 3 ppm (Chloride ion conc.) | | | | | |
|  | Ion exchanged water | Balance | | | | | |
| Example 4 | Sulfuric acid | 100 | The same as above | The same as above | 1.2 | None | None |
|  | Hydrogen peroxide | 15 | | | | | |
|  | 5-Phenyltetrazole | 0.05 | | | | | |
|  | Cresol sulfonic acid | 1 | | | | | |
|  | Sodium chloride | 2 ppm (Chloride ion conc.) | | | | | |
|  | Ion exchanged water | Balance | | | | | |
| Example 5 | Sulfuric acid | 200 | The same as above | The same as above | 1.3 | None | None |
|  | Hydrogen peroxide | 50 | | | | | |
|  | 5-Phenyltetrazole | 0.35 | | | | | |
|  | Cresol sulfonic acid | 10 | | | | | |
|  | Sodium chloride | 10 ppm (Chloride ion conc.) | | | | | |
|  | Ion exchanged water | Balance | | | | | |
| Example 6 | Sulfuric acid | 200 | | | | | |
|  | Hydrogen peroxide | 50 | | | | | |
|  | 5-Phenyltetrazole | 0.35 | The same as above | The same as above | 1.3 | None | None |
|  | Sodium chloride | 10 ppm (Chloride ion conc.) | | | | | |
|  | Ion exchanged water | Balance | | | | | |
| Comparative Example 1 | Sulfuric acid | 100 | Fine and shallow microscopic pits were formed | Prepreg swelled | 0.2 | None | None |
|  | Hydrogen peroxide | 30 | | | | | |
|  | Phenol sulfonic acid | 2 | | | | | |
|  | Sodium chloride | 3 ppm (Chloride ion conc.) | | | | | |
|  | Ion exchanged water | Balance | | | | | |
| Comparative Example 2 | Sulfuric acid | 100 | The same as above | The same as above | 0.3 | None | None |
|  | Hydrogen peroxide | 30 | | | | | |
|  | 5-Phenyltetrazole | 0.2 | | | | | |
|  | Ion exchanged water | Balance | | | | | |
| Comparative Example 3 | Sulfuric acid | 100 | The same as above | The same as above | 0.3 | None | None |
|  | Hydrogen peroxide | 30 | | | | | |
|  | Tetrazole | 0.2 | | | | | |
|  | Sodium chloride | 3 ppm (Chloride ion conc.) | | | | | |
|  | Ion exchanged water | Balance | | | | | |
| Comparative Example 4 | Sulfuric acid | 100 | The same as above | No swelling of prepreg | 0.3 | None | A brown tacky material floated on |
|  | Hydrogen peroxide | 30 | | | | | |
|  | Benzotriazole | 0.2 | | | | | |
|  | Sodium chloride | 3 ppm | | | | | |

TABLE 1-continued

|  | Composition (g/l) |  | Surface after micro-etching | Solder heat resistance | Peel strength (N/mm) | Haloing | Precipitate |
| --- | --- | --- | --- | --- | --- | --- | --- |
| Comparative Example 5 | Ion exchanged water (Oxide treatment) | (Chloride ion conc.) Balance | Fine needle-like crystals were formed | The same as above | 1.4 | Haloing existed | the liquid surface. — |

As shown in Table 1, a copper surface with deep microscopic pits exhibiting superior adhesion to resins can be obtained by using the micro-etching composition of the present invention.

In contrast, the microscopic pits formed on the copper surface using the compositions in the Comparative Examples 1, 2, and 3 containing an azole compound other than phenyltetrazole were shallow and exhibited inferior adhesion to prepreg.

Fine and shallow microscopic pits were formed on the copper surface of Comparative Example 4. The sample product exhibited only poor peel-off resistance in spite of good solder heat resistance. This is due to the use of benzotriazole as an azole compound. In addition, a precipitate estimated as the reaction product of beozotriazole and hydrogen peroxide was seen.

30 g of copper was dissolved in 1 l of the micro-etching compositions of Example 1 and Comparative Example 4. Each solution was allowed to stand for 168 hours at 25° C. to examine stability of hydrogen peroxide. As a result, the residual rates of hydrogen peroxide in the micro-etching compositions of Example 1 and Comparative Example 4 were respectively 95% and 70%, indicating an insufficient effect of suppressing hydrogen peroxide decomposition of the micro-etching composition of Comparative Example 4.

A micro-etching composition for copper or copper alloys exhibiting improved adhesion to resins and capable of providing continuous treatment of copper and copper alloys without producing a brown or black deposit, and a method of micro-etching using this micro-etching composition are provided by the present invention.

The micro-etching composition of the present invention, which employs sulfuric acid and hydrogen peroxide, widely used in the manufacturing processes for printed circuit boards as base materials, ensures easy process control and continuous operation.

Furthermore, the printed circuit board of the present invention ensures excellent adhesion between inner layer circuit patterns and insulation resin layers, and is thus free from haloing.

Obviously, numerous modifications and variations of the present invention are possible in light of the above teachings. It is therefore to be understood that, within the scope of the appended claims, the invention may be practiced otherwise than as specifically described herein.

What is claimed is:

1. An aqueous solution for micro-etching copper or a copper alloy comprising a main ingredient consisting of sulfuric acid and hydrogen peroxide, an assisting ingredient consisting of phenyltetrazole and a chloride ion source, and a benzene sulfonic acid.

2. The aqueous solution according to claim 1, wherein the concentration of sulfuric acid is 60–220 g/l.

3. The aqueous solution according to claim 1, wherein the concentration of hydrogen peroxide is 5–70 g/l.

4. The aqueous solution according to claim 1, wherein the phenyltetrazole is 1-phenyltetrazole or 5-phenyltetrazole.

5. The aqueous solution according to claim 1, wherein the concentration of the phenyltetrazole is 0.01–0.4 g/l.

6. The aqueous solution according to claim 1, wherein the chloride ion source is one or more compounds selected from the group consisting of sodium chloride, potassium chloride, animonium chloride, and hydrochloric acid.

7. The aqueous solution according to claim 1, wherein the concentration of the chloride ion source is 1–60 ppm.

8. The aqueous solution according to claim 1, wherein the concentration of the benzene sulfonic acid is 10 g/l or less.

9. The aqueous solution according to claim 1, wherein the benzene sulfonic acid is one or more compounds selected from the group consisting of benzene sulfonic acid, toluene sulfonic acid, m-xylene sulfonic acid, phenol sulfonic acid, cresol sulfonic acid, sulfosalicylic acid, m-nitro benzene sulfonic acid, and p-amino benzene sulfonic acid.

10. The aqueous solution according to claim 1, wherein the concentration of the benzene sulfonic acid is 2 to 4 g/l.

* * * * *